US008975621B2

(12) United States Patent
Kim et al.

(10) Patent No.: US 8,975,621 B2
(45) Date of Patent: Mar. 10, 2015

(54) ORGANIC LIGHT EMITTING DISPLAY DEVICE

(71) Applicant: Samsung Display Co., Ltd., Yongin (KR)

(72) Inventors: Young-Min Kim, Yongin (KR); Deok-Chan Yoon, Yongin (KR); Kie-Hyun Nam, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/010,290

(22) Filed: Aug. 26, 2013

(65) Prior Publication Data
US 2014/0291629 A1    Oct. 2, 2014

(30) Foreign Application Priority Data

Apr. 2, 2013  (KR) .......................... 10-2013-0035917

(51) Int. Cl.
| H01L 29/08 | (2006.01) |
| H01L 35/24 | (2006.01) |
| H01L 51/00 | (2006.01) |
| H01L 29/04 | (2006.01) |
| H01L 31/036 | (2006.01) |
| H01L 31/0376 | (2006.01) |
| H01L 31/20 | (2006.01) |
| H01L 29/15 | (2006.01) |
| H01L 31/062 | (2012.01) |
| H01L 31/113 | (2006.01) |
| H01L 27/32 | (2006.01) |

(52) U.S. Cl.
CPC .................................. H01L 27/3274 (2013.01)
USPC ................. 257/40; 257/59; 257/72; 257/291; 257/E51.005; 257/E51.006; 257/E51.018

(58) Field of Classification Search
USPC ........ 257/40, 59, 72, 291, E51.005, E51.006, 257/E51.018
See application file for complete search history.

(56) References Cited

U.S. PATENT DOCUMENTS

| 5,801,485 | A | * | 9/1998 | Van Veen et al. ............. 313/495 |
| 6,081,071 | A | * | 6/2000 | Rogers ........................... 313/512 |
| 7,655,948 | B2 | * | 2/2010 | Oh .................................. 257/59 |
| 7,830,090 | B2 | * | 11/2010 | Seon et al. .................... 313/560 |
| 7,964,521 | B2 | * | 6/2011 | Son et al. ........................ 501/24 |
| 7,994,697 | B2 | * | 8/2011 | Park .............................. 313/495 |
| 8,227,983 | B2 | * | 7/2012 | Lee et al. ...................... 313/512 |
| 8,368,860 | B2 | * | 2/2013 | Park et al. ..................... 349/139 |

(Continued)

FOREIGN PATENT DOCUMENTS

KR   10-2009-0015293   2/2009

Primary Examiner — Ida M Soward
(74) Attorney, Agent, or Firm — Knobbe Martens Olson & Bear LLP

(57) ABSTRACT

An organic light emitting display device includes a first substrate including a pixel area and a non-pixel area; a pixel array formed on the pixel area of the first substrate; a protective layer formed over the pixel array, and having a trench that exposes at least a portion of the non-pixel area; a second substrate disposed above the first substrate; a sealing material disposed between the second substrate and the protective layer at the outside of the trench; and a getter disposed between the second substrate and the first substrate exposed by the trench. Moisture and/or oxygen penetrated through the sealing material and the protective layer, which are disposed at a side of the organic light emitting display device, are absorbed into the getter, thereby improving the lifespan of the organic light emitting display device.

14 Claims, 3 Drawing Sheets

(56) References Cited

U.S. PATENT DOCUMENTS

| | | | |
|---|---|---|---|
| 2002/0024096 A1* | 2/2002 | Yamazaki et al. | 257/359 |
| 2007/0030439 A1* | 2/2007 | Kinoshita et al. | 349/158 |
| 2009/0039780 A1 | 2/2009 | Kim et al. | |
| 2009/0174855 A1* | 7/2009 | Andrews et al. | 349/153 |
| 2009/0261719 A1* | 10/2009 | Nimura et al. | 313/504 |
| 2010/0302483 A1* | 12/2010 | Peng et al. | 349/106 |
| 2011/0233549 A1* | 9/2011 | Yi | 257/53 |
| 2012/0075261 A1* | 3/2012 | Ryu et al. | 345/204 |
| 2012/0113050 A1* | 5/2012 | Wang et al. | 345/174 |
| 2012/0319961 A1* | 12/2012 | Liu | 345/173 |
| 2014/0138668 A1* | 5/2014 | You et al. | 257/40 |

\* cited by examiner

ORGANIC LIGHT EMITTING DISPLAY DEVICE

RELATED APPLICATIONS

This application claims priority to and the benefit of Korean Patent Application No. 10-2013-0035917, filed on Apr. 2, 2013, in the Korean Intellectual Property Office, the entire contents of which are incorporated herein by reference in their entirety.

BACKGROUND

1. Field

An aspect of the present invention relates to an organic light emitting display device.

2. Description of the Related Technology

An organic light emitting device includes an anode electrode, a cathode electrode, and an organic light emitting layer interposed between the anode and cathode electrodes. If a predetermined voltage is applied to the anode and cathode electrodes, holes injected through the anode electrode and electrons injected through the cathode electrode are recombined in the organic light emitting layer, and light is emitted from the organic light emitting layer by an energy difference generated in this process.

Since the organic light emitting device includes an organic material, which is typically weak against moisture and/or oxygen, the device needs to be protected from the moisture and/or oxygen, using a sealing material.

Such a display device including the organic light emitting device is typically weak against moisture and/or oxygen, but has excellent characteristics in terms of viewing angle, contrast, response speed, power consumption, etc. Hence, the application range of these display devices has been extended from a portable terminal to a television (TV). As customers' demands increase, the size of the display device is gradually increased.

While the thickness of an organic light emitting display device is decreased, the size of the surface area of the organic light emitting display device is increased. Hence, the selection of a sealing material is difficult, and it is difficult to completely prevent moisture and/or oxygen from being penetrated into the organic light emitting display device, using only the sealing material.

SUMMARY OF CERTAIN INVENTIVE ASPECTS

Embodiments provide an organic light emitting display device capable of effectively preventing moisture or oxygen from being penetrated therein.

According to an aspect of the present invention, an organic light emitting display device may include: a first substrate including a pixel area and a non-pixel area; a pixel array formed on the pixel area of the first substrate; a protective layer formed over the pixel array, and having a trench that exposes at least a portion of the non-pixel area; a second substrate disposed above the first substrate; a sealing material disposed between the second substrate and the protective layer at the outside of the trench; and a getter disposed between the second substrate and the first substrate exposed by the trench.

The protective layer may be made of an inorganic matter selected from the group consisting of SiNx, SiOx, SiOC and SiC. The protective layer may be formed to have a thickness of about 0.01 to 100 µm.

The sealing material may be made of frit or epoxy. The getter may be made of a liquid or solid material in a gel state.

According to an embodiment, although moisture or oxygen is penetrated through the sealing material and the protective layer, which are disposed at a side of the organic light emitting display device, the penetrated moisture or oxygen can be completely absorbed into the getter, thereby improving sealing performance. Further, the degradation of the organic light emitting display device, caused by the moisture or oxygen, can be prevented, thereby improving the lifespan of the organic light emitting display device.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals generally refer to like elements throughout.

DETAILED DESCRIPTION OF CERTAIN INVENTIVE EMBODIMENTS

Figure 1:
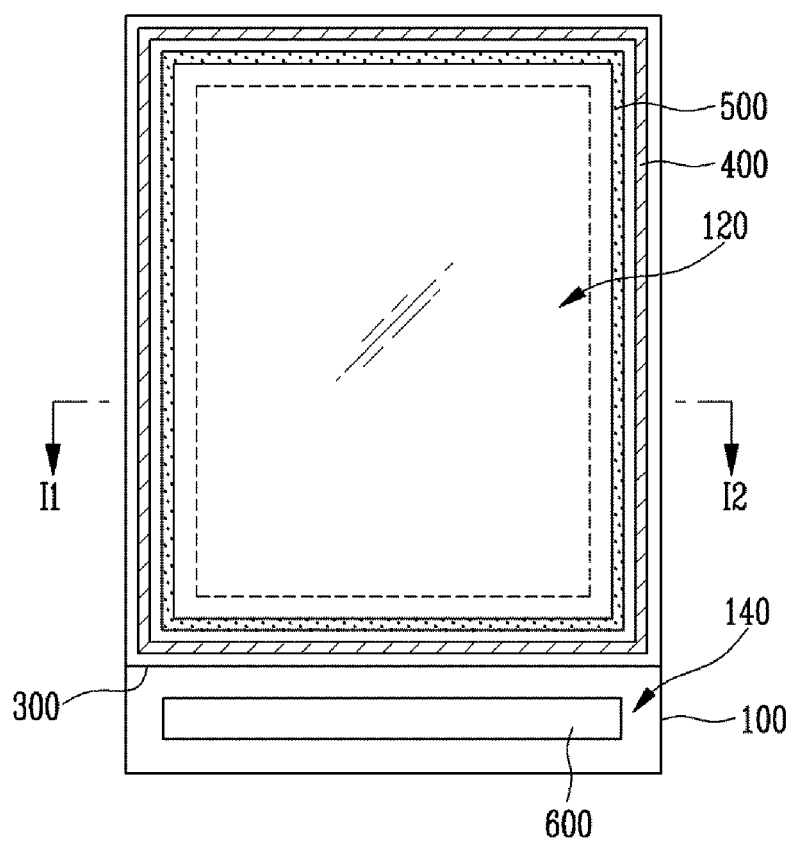
FIG. 1 is a plan view illustrating an organic light emitting display device according to an embodiment of the present invention.

Hereinafter, certain embodiments according to the present invention will be described with reference to the accompanying drawings. When a first element is described as being coupled to a second element, the first element may be not only directly coupled to the second element but may also be indirectly coupled to the second element via a third element. Further, some of the elements that are not essential to the complete understanding of the invention are omitted from the description for clarity. Also, like reference numerals generally refer to like elements throughout.

Figure 2:
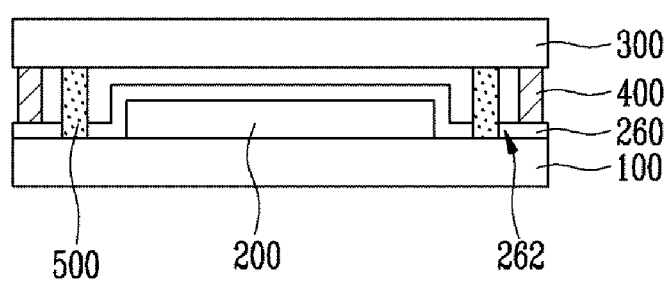
FIG. 2 is a sectional view taken along line I1-I2 of FIG. 1.

FIG. 1 is a plan view illustrating an organic light emitting display device according to an embodiment of the present invention. FIG. 2 is a sectional view taken along line I1-I2 of FIG. 1.

Referring to FIGS. 1 and 2, the organic light emitting display device includes a first substrate 100, a second substrate 300 disposed above the first substrate 100, a sealing material 400 disposed between the first and second substrates 100 and 300 so that a pixel array 200 is sealed, and a getter 500 disposed between the first and second substrates 100 and 300 inside the sealing material 400.

The first substrate 100 includes a pixel area 120 and a non-pixel area 140 around the pixel area 120. The first substrate 100 has a thin film shape, and may be made of glass, plastic or metal.

The pixel array 200 for displaying an image may be disposed in the pixel area 120, and a driving circuit 600 for operating the pixel array 200 may be disposed in the non-pixel area 140.

Figure 3:
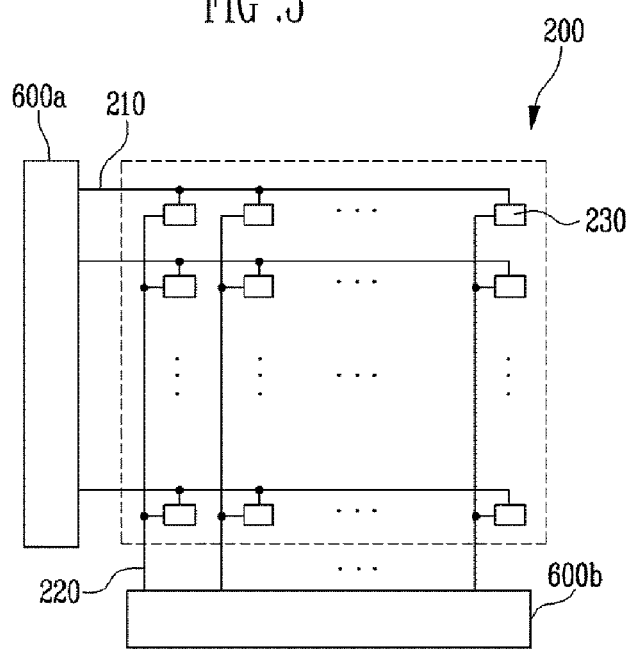
FIG. 3 is a schematic view illustrating a pixel array shown in FIG. 1.

Referring to FIG. 3, the pixel array 200 includes a plurality of scan lines 210 arranged in one direction, a plurality of data lines 220 arranged to intersect the scan lines 210, and a plurality of pixels 230 connected between the scan and data lines 210 and 220. Each pixel 230 may include an organic light emitting device 240 (shown in FIG. 4).

Figure 4:
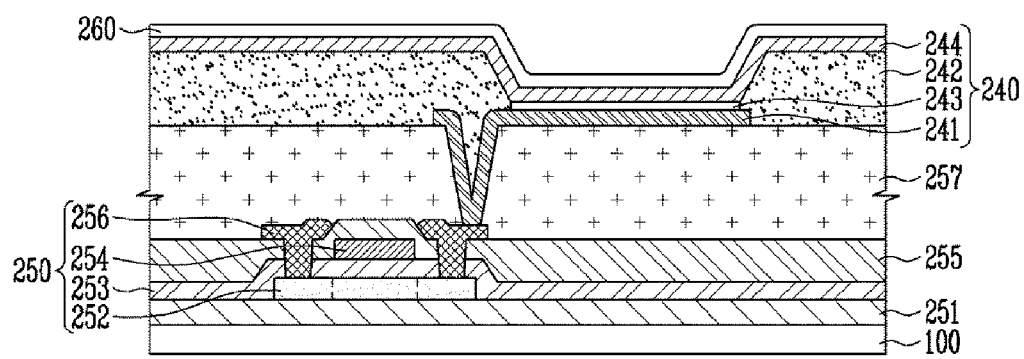
FIG. 4 is a sectional view illustrating a pixel shown in FIG. 3.

Referring to FIG. 4, the organic light emitting device 240 includes a first electrode 241, a second electrode 244 and an organic light emitting layer 243 interposed between the first and second electrodes 241 and 244. The organic light emitting layer 243 is formed on the first electrode 241 in an opening (light emitting region) defined by a pixel defining layer 242, and may include a hole injection layer, a hole transport layer, an electron transport layer and an electron injection layer.

A thin film transistor 250 for transmitting a signal and a capacitor for maintaining the signal may be coupled to the organic light emitting device 240.

For example, the thin film transistor 250 includes a semiconductor layer 252 providing source and drain regions and a channel region, a gate electrode 254 insulated from the semiconductor layer 252 by a gate insulation layer 253, and source and drain electrodes 256 respectively coupled to the semiconductor layers 252 of the source and drain regions through contact holes formed in an insulation layer 255 and the gate insulation layer 253. Reference numeral 251 represents a buffer layer, and reference numeral 257 represents a planarized insulation layer.

A protective layer 260 for protecting the organic light emitting device 240 is formed on the first substrate 100 including the pixel array 200 configured as described above. The protective layer 260 is preferably formed of an inorganic matter capable of preventing penetration of moisture or oxygen and physically maintaining a predetermined strength. The inorganic matter may be selected from the group consisting of SiNx, SiOx, SiOC and SiC. The protective layer 260 may be formed into a single- or multi-layered structure. The protective layer 260 may be formed to have a thickness of about 0.01 to about 100 μm.

Referring to FIG. 3, the driving circuit 600 may include a scan driving circuit 600a coupled to the plurality of scan lines 210, and a data driving circuit 600b coupled to the plurality of data lines 220. The scan driving circuit 600a and the data driving circuit 600b may be configured as one integrated circuit (IC).

The second substrate 300 is an encapsulation substrate for encapsulating the pixel array 200. The second substrate 300 is disposed to face the pixel area 120 and the non-pixel area 140. In a case where the organic light emitting display device has a front light emitting structure, the second substrate 300 may be made of a transparent material such as glass. In a case where the organic light emitting display device has a rear light emitting structure, the second substrate 300 may be made of an opaque material.

The sealing material 400 is disposed between the first and second substrates 100 and 300 in the non-pixel area so as to surround the pixel array 200. The sealing material 400 is adhered to the first and second substrates 100 and 300 so that the internal space including the pixel array 200 is sealed. The sealing material 400 may be formed of an inorganic or organic matter. The inorganic matter may include frit, and the organic matter may include epoxy.

The getter 500 is used to absorb moisture and/or oxygen penetrated through the sealing material 400. The getter 500 is disposed between the first and second substrates 100 and 300 inside the sealing material 400. The getter 500 comes in direct contact with the first substrate 100, and to this end, a trench 262 may be formed in the protective layer 260 (refer to FIG. 2).

Figure 5:
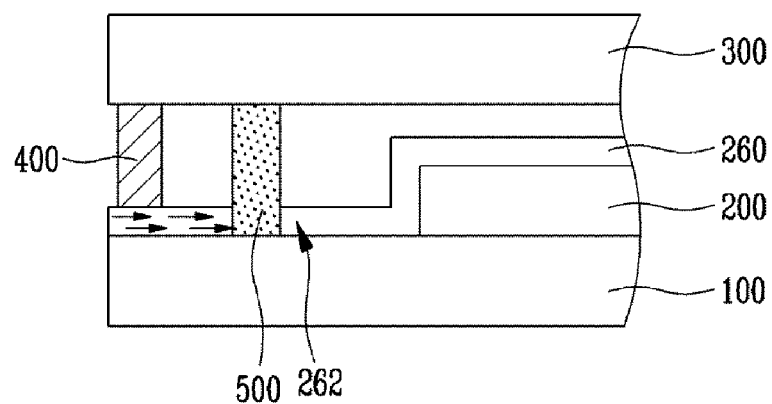
FIG. 5 is a sectional view illustrating a portion of the organic light emitting display device according to the embodiment of the present invention.

FIG. 5 is a sectional view illustrating a portion of the organic light emitting display device according to an embodiment of the present invention. The sealing material 400 is disposed between the second substrate 300 and the protective layer 260 at the outside of the trench 262, but the getter 500 is disposed between the second substrate 300 and the first substrate 100 exposed by the trench 262.

Therefore, the pixel array 200 is completely sealed by the first substrate 100, the second substrate 300 and the sealing material 400. However, when the physical property of the sealing material 400 is deteriorated or when the interface between the sealing material 400 and the protective layer 260 or (and) the interface between the sealing material 400 and the second substrate 300 has (have) a contact failure, moisture and/or oxygen may be penetrated from the outside through the interface. Further, the moisture and/or oxygen may also be penetrated through the protective layer 260.

Figure 6:
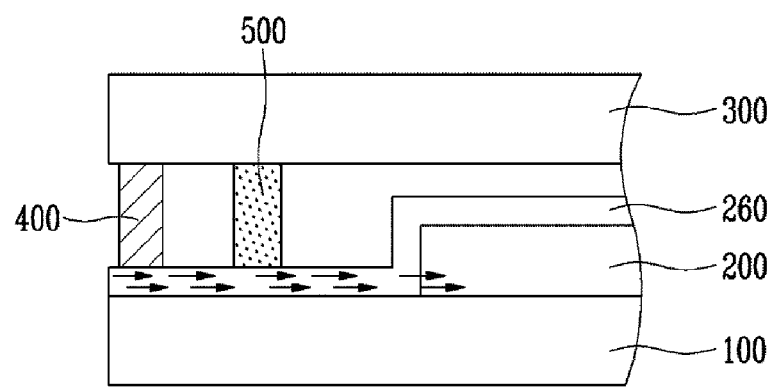
FIG. 6 is a sectional view illustrating a portion of the organic light emitting display device according to the embodiment of the present invention.

In a case where the sealing material 400 and the getter 500 are formed on the protective layer 260 as shown in FIG. 6, moisture and/or oxygen penetrated through the sealing material 400 may be absorbed into the getter 500. However, moisture and/or oxygen (arrow) penetrated through a side of the protective layer 260 is not absorbed into the getter 500. Hence, the moisture and/or oxygen may reach the pixel array 200.

However, according to this embodiment, the getter 500 comes in direct contact with the first substrate 100 exposed by the trench 262 as shown in FIG. 5, and hence the moisture and/or oxygen penetrated through the side of the protective layer 260 may also be absorbed into the getter 500.

The width and height of the getter 500 for obtaining a sufficient effect may be adjusted with the width and breadth of the trench 262. If a liquid material in the state of gel having a predetermined viscosity is used as the getter 500, the getter 500 inside the trench 262 can be easily disposed. The liquid material may include, for example, a compound (compound including a Group I or II element, e.g., CaO, BaO, MgO or the like) including alkali or alkali earth metal having a high reactivity with moisture and/or oxygen. The compound may be made in the state of gel by being mixed with liquid silicon or the like.

In a case where a solid material is used as the getter 500, the getter 500 is formed, for example, in the shape of a tape, thereby easily disposing the getter 500 inside the trench 262. The solid material may include a compound (compound including a Group I or II element, e.g., CaO, BaO, MgO or the like) including alkali or alkali earth metal having a high reactivity with moisture and/or oxygen.

According to this embodiment, the moisture and/or oxygen penetrated through the sealing material 400 or the protective layer 260 is completely absorbed into the getter 500, so that it is possible to improve sealing performance and to prevent degradation of the organic light emitting device 240, caused by the moisture and/or oxygen.

In order to maximize the effect of the present invention, the trench 262 may be formed in a stripe shape to surround the circumference of the pixel array 200. The trench 262 may be formed into a double or triple structure.

Figure 7:
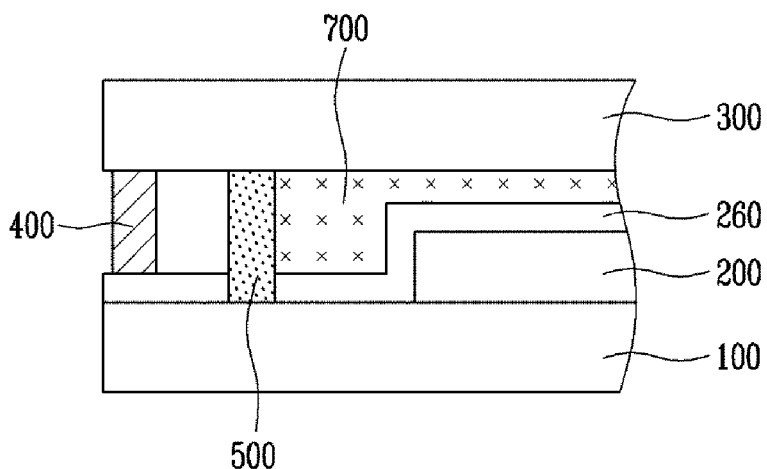
FIG. 7 is a sectional view illustrating an organic light emitting display device according to another embodiment of the present invention.

FIG. 7 is a sectional view illustrating an organic light emitting display device according to another embodiment of the present invention. A filling material 700 is filled between the protective layer 260 and the second substrate 300 inside the sealing material 400. The interval between the first and second substrates 100 and 300 is consistently maintained by the filling material 700, so that the pixel array 200 is safely protected. Simultaneously, the penetration of moisture and/or oxygen is prevented by the filling material 700, so that the lifespan of the organic light emitting display device is improved.

The filling material 700 may be made of a colorless solid or liquid material having 95% or more transmittance. For example, the liquid material may include polyimide, epoxy, urethane acrylate, epoxy acrylate or silicon series (e.g., bisphenol A-type epoxy, cycloaliphatic epoxy resin, phenyl silicon resin or rubber, acrylic epoxy resin, aliphatic urethane acrylate, and the like) resin. The filling material 700 may be formed by filling a liquid material and then curing the filled liquid material, using electron beam or ultraviolet (UV).

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting display device, comprising:
   a first substrate including a pixel area and a non-pixel area;
   a pixel array formed over the pixel area of the first substrate;
   a protective layer formed over the pixel array, and having a trench that exposes at least a portion of the non-pixel area;
   a second substrate disposed over the first substrate;
   a sealing material disposed between the second substrate and the protective layer at the outside of the trench; and
   a getter disposed between the second substrate and the first substrate, wherein the getter is formed in the trench of the protective layer to come into contact with the first substrate and to thereby absorb moisture and oxygen penetrated through a side of the protective layer.

2. The organic light emitting display device of claim 1, wherein the first substrate is made of a material selected from the group consisting of glass, plastic and metal.

3. The organic light emitting display device of claim 1, wherein the pixel array includes:
   a plurality of scan lines arranged in one direction;
   a plurality of data lines arranged to intersect the scan lines; and
   a plurality of pixels formed at the intersections of the scan and data lines.

4. The organic light emitting display device of claim 3, wherein each pixel includes:
   a first electrode;
   an organic light emitting layer disposed over the first electrode; and
   a second electrode disposed over the organic light emitting layer.

5. The organic light emitting display device of claim 1, wherein the protective layer is made of an inorganic matter.

6. The organic light emitting display device of claim 5, wherein the inorganic matter is selected from the group consisting of SiNx, SiOx, SiOC and SiC.

7. The organic light emitting display device of claim 1, wherein the protective layer is formed to have a thickness of about 0.01 to about 100 μm.

8. The organic light emitting display device of claim 1, wherein the trench surrounds the pixel area.

9. The organic light emitting display device of claim 1, wherein the sealing material is made of one of frit or epoxy.

10. The organic light emitting display device of claim 1, wherein the getter is made of a liquid material in a gel state.

11. The organic light emitting display device of claim 1, wherein the getter is made of a solid material.

12. The organic light emitting display device of claim 1, further comprising a filling material interposed between the second substrate and the protective layer inside the sealing material.

13. The organic light emitting display device of claim 12, wherein the filling material is made of a material selected from the group consisting of polyimide, epoxy, urethane acrylate, epoxy acrylate and silicon.

14. The organic light emitting display device of claim 10, wherein the liquid material includes alkali or alkali earth metal mixed with liquid silicon.

* * * * *